United States Patent [19]
Abe

[11] Patent Number: 5,708,612
[45] Date of Patent: Jan. 13, 1998

[54] SEMICONDUCTOR MEMORY DEVICE

[75] Inventor: Kazuhiko Abe, Tokyo, Japan

[73] Assignee: NEC Corporation, Japan

[21] Appl. No.: 634,252

[22] Filed: Apr. 18, 1996

[30] Foreign Application Priority Data

Apr. 20, 1995 [JP] Japan .................................. 7-095253

[51] Int. Cl.$^6$ .................................................. G11C 7/00
[52] U.S. Cl. ................................. 365/200; 365/230.03
[58] Field of Search .......................... 365/230.03, 200, 365/230.06, 201

[56] References Cited

U.S. PATENT DOCUMENTS 5,459,690  10/1995  Rieger ............................ 365/230.03

Primary Examiner—A. Zarabian

[57] ABSTRACT

When a test mode signal is at an inactive level, a redundant cell column control circuit selects redundant cell column select signals. When the test mode signal is at an active level, the circuit selects a predetermined bit from the column select signal to output redundant cell column selection control signals, which are supplied to redundant cell column switch circuits. In a test mode, all blocks are set to an active state to select a predetermined memory cell column, and the redundant cell columns are concurrently selected. An accelerated biassing test can be conducted for all redundant cell columns within a competent test time.

4 Claims, 11 Drawing Sheets

SEMICONDUCTOR MEMORY DEVICE

BACKGROUND OF THE INVENTION

The present invention relates to a semiconductor memory device, and in particular, to a semiconductor memory device with redundant circuits for recovering non-conforming memory cells.

DESCRIPTION OF THE RELATED ART

The semiconductor memory device has been undergone ceaseless developments in processing techniques for a miniturization as well as for an enlarged storage capacity, accompanying the use of a redundant circuit technique for recovering non-conforming memory cells to achieve an improved yield in production.

Such the semiconductor memory device has generally been subjected, in an initial testing process after production, to an accelerated biassing test of which results were employed in a subsequent conformity check of products.

In the biassing test, all the memory cells of each tested product were forced to continuously work under a high-temperature, high-voltage condition for a long interval of time. In the conformity check, non-conforming products were rejected.

Recent years have observed a number of steps of enlargement in storage capacity of the semiconductor memory device accompanying a progressively extended testing time for which a continuous working has been required of the whole of memory cells.

In this respect, the semiconductor memory device typically has a four-folded number of memory cells, when developed anew, which needs a simply four-folded length of time to be taken for a continuous working of the whole of the memory cells. In other words, a four-folded storage capacity requires a four-folded time for the biassing test.

For example, in a case of a 1M-bit static RAM that had required a test time of 24 hours, a developed 4M-bit static RAM required a 96-hour test to keep an identical quality in initial rejection of non-conforming products, constituting a factor to cause a significant reduction in productivity of the semiconductor memory device.

Therefore, as a measure for rendering the test time short without degrading a quality of the accelerated biassing test, there has been employed a method including a test mode in which a plurality of memory blocks provided as divided parts of a memory cell array or as a plurality of memory cell arrays are concurrently operated for selecting one of word lines arranged for each of them to have an increased number of memory cells concurrently selected for their working, so that a necessary time for the continuous working of the whole of memory cells becomes short, resulting in a shorter test time of the biassing test.

FIG. 1 shows in a block diagram a conventional semiconductor memory device as a static RAM employing the redundant circuit technique as well as the test mode for the accelerated biassing test, and FIGS. 2 to 5, exemplary partial circuits thereof, respectively.

The conventional semiconductor memory device comprises a total of n blocks BKj (j=1 to n), where n is a predetermined integer, and a total of seven common circuits thereto.

More specifically, the conventional semiconductor memory device comprises: a total of n memory cell arrays MAj each respectively consisting of a total of N+1 columns of memory cells addressed in a matrix, such as by e.g. (x,y), where N is a predetermined integer such that e.g. $n(N+1) = y_{max}$; a total of n circuit combinations associated with the n memory cell arrays MAj, respectively, the n circuit combinations each respectively including a column RMj of redundant memory cells, a row address decoder DXj, a column switch circuit YSWj, a redundant cell column switch circuit RSWj and a sense amplifying write circuit AWj, the n circuit combinations (RMj, DXj, YSWj, RSj, AWj) each respectively cooperating with a corresponding memory cell array MAj to constitute a corresponding block BKj; and the common circuits including a total of three addressing-oriented circuits, i.e. a row address buffer circuit 1, a column address buffer circuit 2 and a column address decoder 5. a fault address program circuit 3 for controlling a replacement between a column of memory cells including a non-conforming memory cell in an arbitrary memory cell array MAj and a corresponding redundant memory cell column RMj, a block decoder or an array decoder 4 for controlling actions of a combination of circuits DXj, YSWj and AWj to select a block BKj to be accessed, a test mode control circuit 6 for generating a test mode signal to execute an accelerated biassing test, and an input/output buffer circuit 8 for temporarily holding a data to be written as well as a read data.

A respective one of the n memory cell arrays MAj is provided with: a plurality of word lines WL of which an arbitrary one has a selection level, when selected by the row address decoder DXj, for setting a total of N+1 memory of a corresponding row to a selected state; and a total of N+1 pairs of bit lines BL (more specifically, BL(1) and BL(2)) of which an arbitrarily selected one pair is responsible for a corresponding column of memory cells (hereafter sometimes "memory cell column") to transmit a write data to one memory cell of the memory cell column that is set to the selected state, and a read data therefrom. The pair of bit lines BL(1) and BL(2) cooperatively provide a pair of complementary signals to define a binary data value.

A respective one of the n redundant memory cell columns RMj has an identical number of redundant memory cells to the number of rows of a corresponding memory cell array MAj, and is provided with: the same number of redundant word lines (that may be extensions of the word lines WL) of which a respective one has a selection level, when a corresponding word line WL has the selection level, for setting an associated redundant memory cell to a selected state; and a pair of redundant bit lines for transmitting a write data to a redundant memory cell of the selected state and a read data therefrom.

The respective redundant memory cell column RMj is employed when the corresponding memory cell array MAj has a non-conforming memory cell, so that it is replaceable with a memory cell column that includes the non-conforming memory cell.

As shown in FIG. 2, a respective one of the n column switch circuits YSWj comprises: a total of N+1 two-input NAND gates G81i (i=0 to N) each respectively receiving at one input terminal thereof a corresponding one of a total of N+1 column select signals Yi (hereafter sometimes collectively "Y") and at the other input terminal thereof a corresponding one of a total of n block select signals or an array selection signals BSj; a total of N=1 two-input NOR gates G82i each respectively receiving at one input terminal thereof an output signal of a corresponding one of the N+1 NAND gates G81i and at the other input terminal thereof a corresponding one of a total of n redundant cell column select signals SYj; a total of N+1 inverters IV8i each respectively for inverting an output signal of a corresponding one of the N+1 NOR gates G82i; a total of N+1 transfer gates TG81i each respectively connected between one BL(1) of a pair of bit lines BL(1) and BL(2) connected to a corresponding memory cell column of a corresponding memory cell array MAj and a corresponding sense amplifying write circuit AWj, the respective transfer gate TG81i being composed of an nMOS transistor for receiving at a gate electrode thereof the output signal of a corresponding NOR gate G82i so that it turns on when the received signal has a high level and a pMOS transistor for receiving at a gate electrode thereof an output signal of a corresponding inverter IV8i so that it turns on when the received signal has a low level; and a total of transfer gates TG82i each respectively connected between the other BL(2) of the pair of bit lines BL(1) and BL(2) connected to the corresponding memory cell column and the corresponding sense amplifying write circuit AWj, the respective transfer gate TG82i being composed of an nMOS transistor for receiving at a gate electrode thereof the output signal of the corresponding NOR gate G82i so that it turns on when the received signal has the high level and a pMOS transistor for receiving at a gate electrode thereof the output signal of the corresponding inverter IV8i so that it turns on when the received signal has the low level. The nMOS and pMOS transistors paired at each transfer gate cooperatively provide an extended margin of operation, as the pMOS transistor covers a threshold voltage drop effect of the nMOS transistor.

The respective column switch circuit YSWj is responsible: for a combination of a selection level or an active level of the corresponding block select signal BSj and an inactive level of the corresponding redundant cell column select signal SYj, to select the corresponding memory cell column, i.e. to connect the pair of bit lines BL(1) and BL(2) of the corresponding memory cell column of the corresponding memory cell array MAj to the corresponding sense amplifying write circuit AWj, in accordance with the column select signal Y (i.e. a combination of the N+1 column select signals Yi): and for a non-selection level or an inactive level of the corresponding block select signal BSj, as well as for a selection level or an active level of the corresponding redundant cell column select signal SYj, to select none of N+1 memory cell columns of the corresponding memory cell array MAj.

A respective one of the n redundant cell column switch circuits RSWj comprises: an inverter IV91 for inverting the level of a corresponding one of the n redundant cell column select signals SYj; and a pair of transfer gates TG91 and TG92 of which a respective one is connected between a corresponding one of the pair of redundant bit lines connected to a corresponding one of the n redundant memory cell columns RMj and a corresponding one of the n sense amplifying write circuits AWj, while the respective transfer gate is composed of an nMOS transistor receiving at a gate electrode thereof the corresponding redundant cell column select signal SYj and a pMOS transistor receiving at a gate electrode thereof an output signal of the inverter IV91.

The respective redundant cell column switch circuit RSWj is responsible for an active level of the corresponding redundant cell column select signal SYj to select the corresponding redundant memory cell column RMj, i.e. to connect this column RMj to the corresponding sense amplifying write circuit AWj.

A respective one of the n sense amplifying write circuits AWj is responsible for an active level of a corresponding one of the n block select signals BSj, for amplifying a read data from that one of the N+1 memory cell columns of a corresponding memory cell array MAj which is selected by a corresponding column switch circuit YSWj or that one of the n redundant cell columns RMj which corresponds thereto and hence is selected by a corresponding redundant cell column switch circuit RSWj, to externally output an amplified data signal via the input/output buffer circuit 8, and for transmitting a data to be written to a selected memory cell of the selected memory cell column or to a corresponding redundant memory cell of the selected redundant cell column RMj.

The row address buffer circuit 1 responds to an input row address signal ADX constituted with a predetermined number of bits, for generating an intra-block row address signal IAX as a combination of inverted signals of the constituent bits of the input signal ADX and non-inverted signals thereof to supply the generated signal IAX to the n row address decoders DXj, of which a respective one is responsible therefor to respond to an active level of a corresponding block select signal BSj for setting to the selection level a corresponding one of the word lines WL of a corresponding memory cell array MAj and a corresponding one of the word lines of a corresponding redundant cell column RMj.

The column address buffer circuit 2 responds to an input column address signal ADY constituted with a total of k+1 bits AYs (s=0 to k), where k is a predetermined integer such that $2^{k+1} \geq n(N+1)$, for generating an internal column address signal IAY composed of a lower-order intra-block address signal IAYL as a combination of respective inverted signals AYs'* (s'=0 to h) of a total of h+1 least significant bits AYs' of the input signal ADY and respective non-inverted signals AYs' thereof, where h is a predetermined integer such that $2^{h+1} \geq N+1$ and the *-mark represents an inverted signal, and an upper-order block-identifying address signal IAYU as a combination of respective inverted signals AYs"* (s"=h+1 to k) of a total of k-h most significant bits AYs" of the input signal ADY and respective non-inverted signals AYs" thereof, so that the internal column address signal IAY comprises a set of respective inverted signals AYs* of the K+1 constituent bits AYs of the input signal ADY and respective non-inverted signals AYs thereof.

The column address decoder 5 decodes the lower-order address signal IAYL to generate the N+1 column select signal Yi.

As shown in FIG. 3, the test mode control circuit 6 comprises: a resistor R61 at one end thereof to a power supply terminal with a power supply voltage Vcc; another resistor R62 connected at one end thereof to the other end of the resister R61 and at the other end thereof to a ground potential point; an nMOS transistor Q62 connected at a gate electrode thereof to an interconnection between the resistors R61 and R62 and at a source electrode thereof to a ground potential point; a pMOS transistor Q61 connected at a source electrode thereof to the power supply terminal, at a gate electrode thereof to a ground potential point and a drain electrode thereof to a drain electrode of the nMOS transistor Q62; and an inverter IV61 for inverting a level of a voltage at an interconnection between the drain electrodes of the transistors Q61 and Q62.

The test mode control circuit 6 is responsible for the power supply voltage Vcc, as it has a higher level (e.g. 8V) than a level (e.g. 5V) for a normal operation, to detect the voltage Vcc to generate a test mode signal TE with a high level or an active level.

As shown in FIG. 5A, the fault address program circuit 3 comprises: a total of n fault address program sections 31 which one-to-one correspond to the n blocks BKj and of which a respective one is adapted to store therein an address of a non-conforming memory cell column (i.e. a memory cell column that has a non-conforming memory cell) in a corresponding one of the n memory cell arrays MAj, and to be responsible for the column address signal ADY (more specifically, the internal column address signal), as it designates the address of the non-conforming memory cell column (hereafter "fault address"), to output a corresponding one of the n redundant cell column select signals SYj with a selection level or an active level; and an n-input NAND gate G31 responsible for the n redundant cell column select signals SYj, as at least one of them has the active level, to generate a selection inhibiting signal KL with a selection level or an active level.

As shown in FIGS. 5A and 5B, a respective one of the n fault address program sections 31 comprises: a total of k+1 fault address program units 30 which one-to-one correspond to a total of k+1 combinations of a non-inverted constituent bit AYs (s=0 to k) and a corresponding inverted constituent bit AYs* of the internal column address signal IAY and of which a respective one includes a fuse F31 receiving the power supply voltage Vcc at one end thereof, an nMOS transistor Q31 connected at a source electrode thereof to a ground potential point and at a drain electrode thereof to the other end of the fuse F31, an inverter IV31 connected at an input terminal and an output terminal thereof to the drain electrode and a gate electrode of the transistor Q31, respectively, another inverter IV33 for level-inverting an output signal of the inverter IV31, a transfer gate TG31 composed of an nMOS transistor receiving at a gate electrode thereof an output signal of the inverter IV33 and a pMOS transistor receiving at a gate electrode thereof the output signal of the inverter IV31, and another transfer gate TG32 composed of an nMOS transistor receiving at a gate electrode thereof the output signal of the inverter IV31 and a pMOS transistor receiving at a gate electrode thereof the output signal of the inverter IV33, the transfer gate TG32 cooperating with the transfer gate TG31 to transfer one of the inverted bit AYs* and the non-inverted bit AYs, so that while the fuse F31 is kept conductive the inverted bit AYs* is output and if it is broken the non-inverted bit AYs is output; a (k+1)-input NAND gate G30 receiving respective output signals AYs* or AYs of the K+1 fault address program units; and an inverter IV30 for level-inverting an output signal of the NAND gate G30 to provide a corresponding one of the n redundant cell column select signals SYj, while the output signal of the NAND gate G30 is supplied to a corresponding input terminal of the NAND gate G31.

The fuse F31, which shall be necessarily cut before a delivery of the product, is kept conductive while a corresponding constituent bit of the column address signal ADY is at a "0" level, until it becomes broken with the corresponding constituent bit at a "1" level so that the fault address in a corresponding one of the n memory cell arrays MAj is logically stored in a corresponding one of the n fault address program sections 31.

As shown in FIG. 4, the block decoder 4 comprises a total of n block selection units 41 that one-to-one correspond to the n blocks BKj, and an inverter IV40 for level-inverting the test mode signal A respective one of the n block selection units 41 comprises: a multi-input NAND gate G41 receiving at a respective one of k-h input terminals thereof one of the inverted signal AYs"* (s"=h+1 to k) and the non-inverted signal AYs" of a corresponding constituent bit of the upper-order column address signal IAYU; a two-input NOR gate G42 receiving at one input terminal thereof an output signal of the NAND gate G41 and at the other input terminal thereof the selection inhibiting signal KL; another two-input NOR gate G43 receiving at one input terminal thereof an output signal of the NOR gate G42 and at the other input terminal thereof a corresponding one of the n redundant cell column select signals SYj: and a two-input NAND gate G44 receiving at one input terminal thereof an output signal of the NOR gate G43 and at the other input terminal thereof an output signal of the inverter IV40, i.e. an inverted signal of the test mode signal TE.

The block decoder 4 is responsible: when the test mode signal TE is at an inactive level, for the n redundant cell column select signals SYj, as an arbitrary one of them has an active level, to render active no more than that one of the n block select signals BSj which corresponds to the arbitrary redundant cell column select signal SYj and for the upper-order column address signal IAYU, as no redundant cell column select signal SYj has the active level, to decode the address signal IAYU to provide each block select signal BSj with an active level or an inactive level, whichever is determined by the decoding; and when the test mode signal TE is at an active level, to render all the block select signals BSj active.

Description will be made of actions of the conventional semiconductor memory device of FIG. 1.

First, as the test mode signal TE is at an inactive level (a low level), the memory device operates in a normal operation mode as follows.

In the normal operation mode, the power supply voltage Vcc is set within a typical range between from about 4.5 V to about 5.5 V, and the test mode controller 6 sets the signal TE to an inactive level, as a matter of course.

Therefore, when all the redundant cell column select signals SYj are at an inactive level (and hence the selection inhibiting signal KL is at an inactive level), namely, when there has been made no replacements to the redundant cell columns RMj, the decoder 4 sets one of the block select signals BSj to an active level according to the upper-order column address signal IAYU. This consequently activates one block, e.g. one memory cell array associated with the select signal BSj in the active state.

The row address decoder DXn of the activated block (e.g. the block BKn) decodes the internal row address signal IAX from the row address buffer circuit 1 to set one of the word lines WL to a selection level and a row of memory cells to a selection state, the row being connected to the word line thus selected. Since the select signal SYn is at an inactive level, the column switch circuit YSWn selects one memory cell column (i.e. one pair of bit lines) according to the column select signal Y (Y0 to YN) attained by decoding the lower-order column address signal IAYL by the column address decoder 5, thereby connecting the memory cell column to the sense amplifying write circuit AWn.

Thereafter, data is read from the memory cells in the selection state of the selected memory cell column to be fed via the column switch circuit YSWn, sense amplifying write circuit AWn, and input/output buffer circuit 8 to an external device. Conversely, write data is fed from an external device to be written and stored in the pertinent memory cells of the selected memory cell column via a path reverse to that used in the data reading action.

When the redundant cell column select signals SYj includes an active signal (e.g. when the signal SY1 is in the active state), the block select signal BS1 associated therewith is set to an active level so that one block (i.e. the memory cell array MA1 corresponding to the signal BS1) is activated.

The row address decoder DX1 then sets one of the word lines to a selection level and then one memory cell row, which is connected to the word line, of the memory cell array MA1 and one redundant cell of the redundant cell column are set to a selection state. On this occasion, since the redundant cell column select signal SY1 is at an active level, the column switch circuit YSW1 sets all memory cell columns of the array MA1 to a non-selection state and the redundant cell column switch circuit RSW1 selects and connects the redundant cell column RM1 to the sense amplifying write circuit AW1.

In this fashion, for the redundant cell in the selection state of the cell column RM1, the data read and write actions are accomplished via the redundant cell column switch circuit RSW1, sense amplifying write circuit AW1, and input/output buffer circuit 8, conducting the replacement of the non-conforming memory cell column of the memory cell array MA1.

As above, the address of the non-conforming memory cell column is logically stored by breaking the fuse 31 of the fault address program unit 30 in the fault address program section 31, the unit 30 being associated with the bit at the level "1" of the constituent bits of the column address signal ADY. According to the program, when the row address signal ADY matches the stored address, the constituent bit AY$i$ at level "1" is output from the program unit 30 of which the fuse F31 is broken, whereas a signal AYi* attained by inverting the bit at level "0", namely, a signal at level "1" is output from the program unit 30 of which the fuse F31 is conductive. In consequence, the signals output from all program units 30 of the program section 31 are at level "1" and the program section 81 accordingly outputs a redundant cell column select signal at an active level.

In the semiconductor memory device, the memory arrays MAj one-to-one correspond to redundant cell columns RMj. In the fault address program section 31, however, the address of a non-conforming memory cell column is programed using all constituent bits of the column address signal ADY to produce a redundant cell column select signal SYj related to the address. Moreover, the system activates a block including the redundant cell column RMj associated with the column select signal SYj at an active level. Consequently, the non-conforming memory cell column needs not to be necessarily replaced with the redundant cell column in the same block. In other words, even when a memory cell array includes two non-conforming memory cell columns, one of the non-conforming memory cell columns may be replaced with the redundant cell column corresponding to a memory cell array not including any non-conforming memory cell column. This remarkably improves yield in the production of semiconductor memory devices. Additionally, the one-to-one correspondence is not necessarily required between the memory cell arrays and redundant cell columns.

Subsequently, description will be given of actions of the semiconductor memory device in the test mode.

In the test mode operation, the power supply voltage Vcc is set to a value. e.g. 8 V which is about 4.5 V to 5.5 V higher than that used in the normal operation mode. On detecting the condition "Vcc=8 V", the test mode controller 6 regulates the test mode signal TE to an active level. The controller 6 sets the signal TE to the inactive level when the voltage Vcc is in a range from 4.5 V to 5.5 V and to the active level when Vcc is 8 V. Consequently, for example, the threshold voltage of the transistor Q62 is set to 0.7 V and the resistance values of the resistors R61 and R62 are respectively equal to 10 k$\Omega$ and 1 K$\Omega$ such that the on resistance of the transistor Q61 is sufficiently larger than that of the transistor Q62 (gate voltage$\geq$0.7 V).

When the signal TE is at the active level, the block decoder 4 activates all block select signals BSj to set all blocks to an active state. Consequently, altering the row address signal ADX and the low-order bits (AY0 to AYh: corresponding to internal column address signal IAYL) of the column address signal ADY, the system can set all memory cells of the memory cell arrays MA1 to MAn to a selection state for the biassing test of the memory device. In short, the system is not required to vary the high-order bits (AY(h+1) to AYk; corresponding to internal column address signal IAYU) of the column address signal ADY. Therefore, the period of time necessary to vary the high-order bits (AY(h+1) to AYk can be reduced and hence the period of time required for the continuous operation of all memory cells is minimized in the biassing test. That is, the period of time used for the test is rendered to 1/n that required in the conventional system.

According to the configuration of the conventional semiconductor memory device, the test mode operation in which the test mode signal TE is at an active level is carried out by altering the row address signal ADX and the low-order bits of the column address signal ADY with all blocks set to an activate state. In consequence, the period of time necessary to change the high-order bits of the column address signal ADY can be reduced to resultantly minimize the total test time. However, the high-order bits of the column address signal ADY are not required to be altered and are therefore fixed to predetermined values. Therefore, when the high-order bits of the address of a non-conforming memory cell columns stored in the fault address program circuit 3 match the fixed high-order bits of the column address signal ADY, the biassing test can be conducted by setting the redundant cell column corresponding to the pertinent non-conforming memory cell column to the selection state. However, it is impossible to effect the biassing test for any redundant cell column associated with an address for which the matching of high-order bits is missing. This leads to a problem that a redundant memory column in which an initial failure is detected cannot be removed depending on cases.

To cope with this problem, there has been known a method in which the address memorized in the fault address program circuit 3 is set again to an appropriate value prior to the biassing test. This, however, accordingly arises a problem that a longer period of time is necessary for the biassing test and the like.

SUMMARY OF THE INVENTION

It is therefore an object of the present invention to provide a semiconductor memory device in which the accelerated biassing test can be achieved for all redundant cell columns without requiring any additional test time, thereby guaranteeing the removal of any redundant cell columns in which the initial failure is detected.

To achieve the object above in accordance with the present invention, there is provided a semiconductor memory device including a plurality of memory cell arrays each including a plurality of memory cell columns, a plurality of redundant memory cell columns which can be replaced, when there exist non-conforming memory cell columns in the plural memory cell arrays, with the non-conforming memory cell columns, and a plurality of column switch circuits disposed respectively corresponding to the plural memory cell arrays.

The column switch circuit selects, when an array select signal associated therewith is at a selection level or an active level and a redundant cell column select signal corresponding thereto is at a non-selection level or an inactive level, a predetermined memory cell column of the associated memory cell array according to a column select signal. The column switch circuit non-select, when the array select signal is at a non-selection level and the redundant cell column select signal is at a selection level or an active level, the memory cell columns of the associated memory cell array.

The memory device further includes a plurality of redundant cell column switch circuits disposed respectively corresponding to the plural redundant memory cell columns for selecting, each of the redundant cell column switch circuits selecting, when a redundant cell column selection control signal associated therewith is at the selection level, a redundant memory cell column corresponding thereto and a plurality of data input/output means disposed respectively corresponding to the plural column switch circuits.

The data input/output means conducts, when the array select signal corresponding thereto is at an active level, transmission of read data from a memory cell column selected by the column switch circuit associated with the means and the redundant memory cell column selected by a predetermined redundant cell column switch circuit and transmission of write data to the memory cell column and the redundant memory cell column.

Also included in the memory device are a test mode control circuit for sensing a preset operation condition and generating a test mode signal at a high level or an active level, a fault address program circuit for storing therein an address of a non-conforming memory cell column of each of the plural memory cell arrays and setting, when a column address signal designates the address, the redundant cell column select signal associated therewith to the selection level, and an array selection circuit for setting, when the test mode signal is at a low level or an inactive level and any one of the redundant cell column select signals is at an active level, the block select signal corresponding to the redundant cell column select signal in the selection level to the selection level.

The array selection circuit decodes predetermined one of the column address signals when the redundant cell column select signals are in the non-selection level, decides the selection or non-selection level of the block select signal, and outputs the signal therefrom. The array selection circuit sets the block select signals to an active level when the test mode signal is at the high level.

The memory device further includes a redundant cell column control circuit for selecting, when the test mode signal is at an inactive level, the redundant cell column select signals from the fault address program circuit and setting the selected redundant cell column select signals as the corresponding redundant cell column selection control signals and selecting, when the test mode signal is at the high level, predetermined bits of the redundant cell column select signal and setting the selected bits as the redundant cell column selection control signal.

In the semiconductor memory device, there exists a one-to-one correspondence between the plural memory cell arrays and the plural redundant memory cell columns.

Moreover, the semiconductor memory device further includes a plurality of redundant memory cell columns only for predetermined one of the plural memory cell arrays.

The array selection circuit sets, when the test mode signal is at the low level and any one of the redundant cell column select signals is at the selection level, only the array select signal associated with the predetermined block to the selection level.

The redundant cell column control circuit allocates, when the test mode signal is at the high level, mutually different bits of the column select signal to each of the plural redundant memory cell columns and each of the redundant cell column selection control signals associated therewith.

The column switch circuit corresponding to the predetermined block selects, only when the corresponding block select signal is at the selection level and the redundant cell column select signals are at an inactive level, a predetermined memory cell column according to the column select signal.

Each of the column switch circuits other than the column switch circuit corresponding to the predetermined memory cell array selects, only when the associated array select signal is at the selection level, a predetermined memory cell column of the corresponding memory cell array according to the column select signal.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Figure 1:
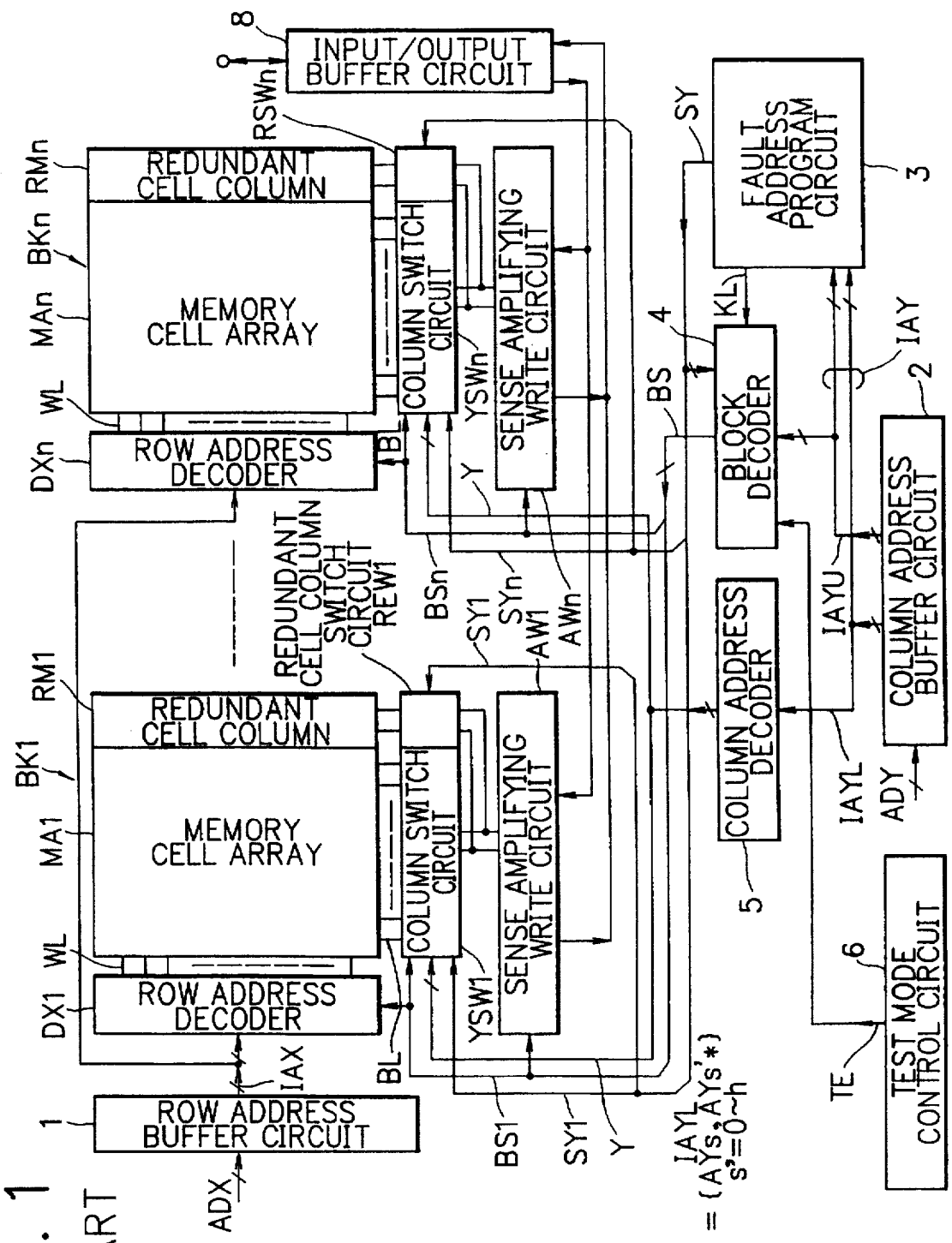
FIG. 1 is a schematic block diagram showing an example of the conventional semiconductor memory device.

Referring now to the accompanying drawings, description will be made the preferred embodiments of the present invention. Like or corresponding members and signals are designated at like reference characters.

Figure 6:
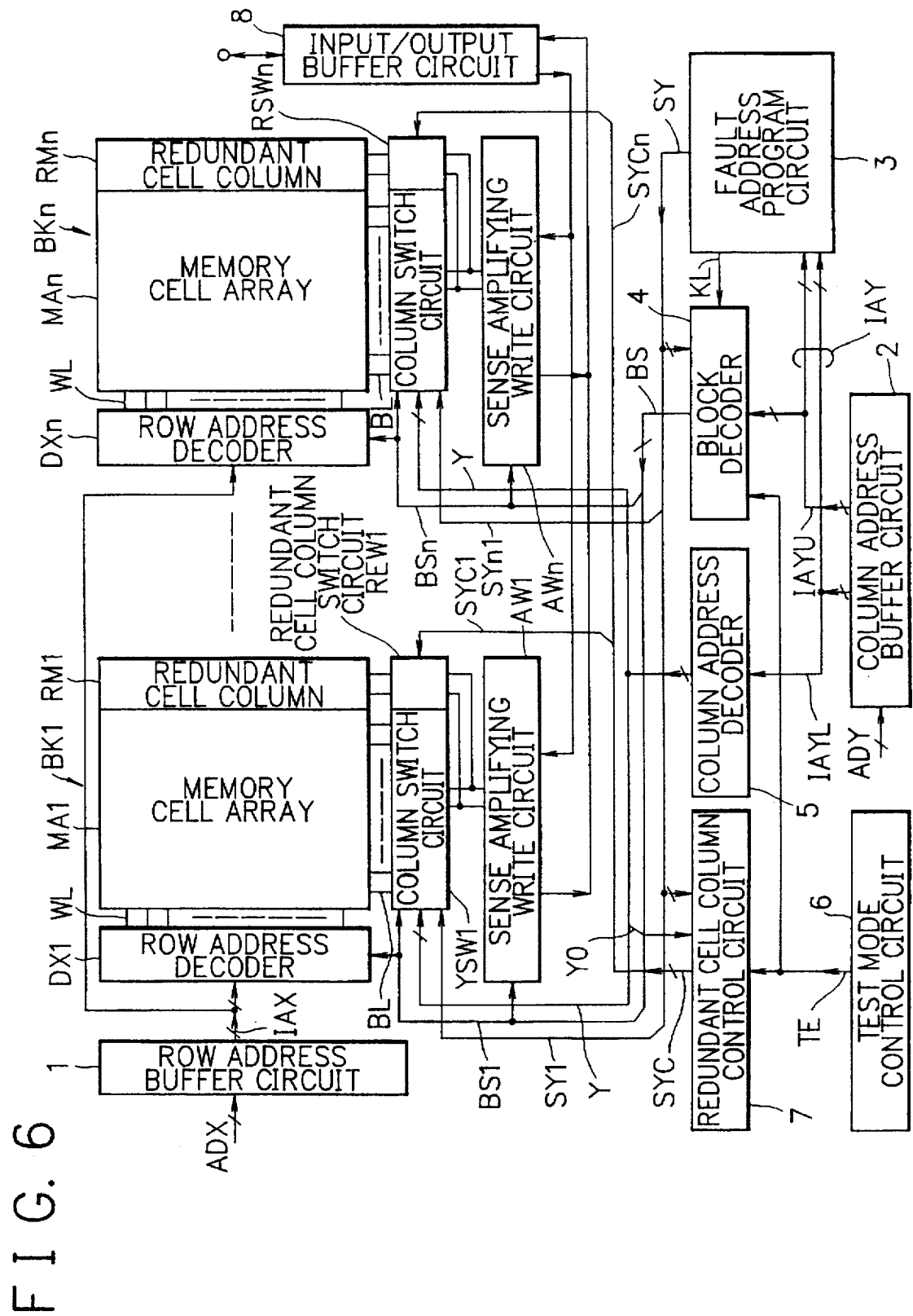
FIG. 6 is a block diagram schematically showing a first embodiment of the semiconductor memory device in accordance with the present invention.
Figure 7:
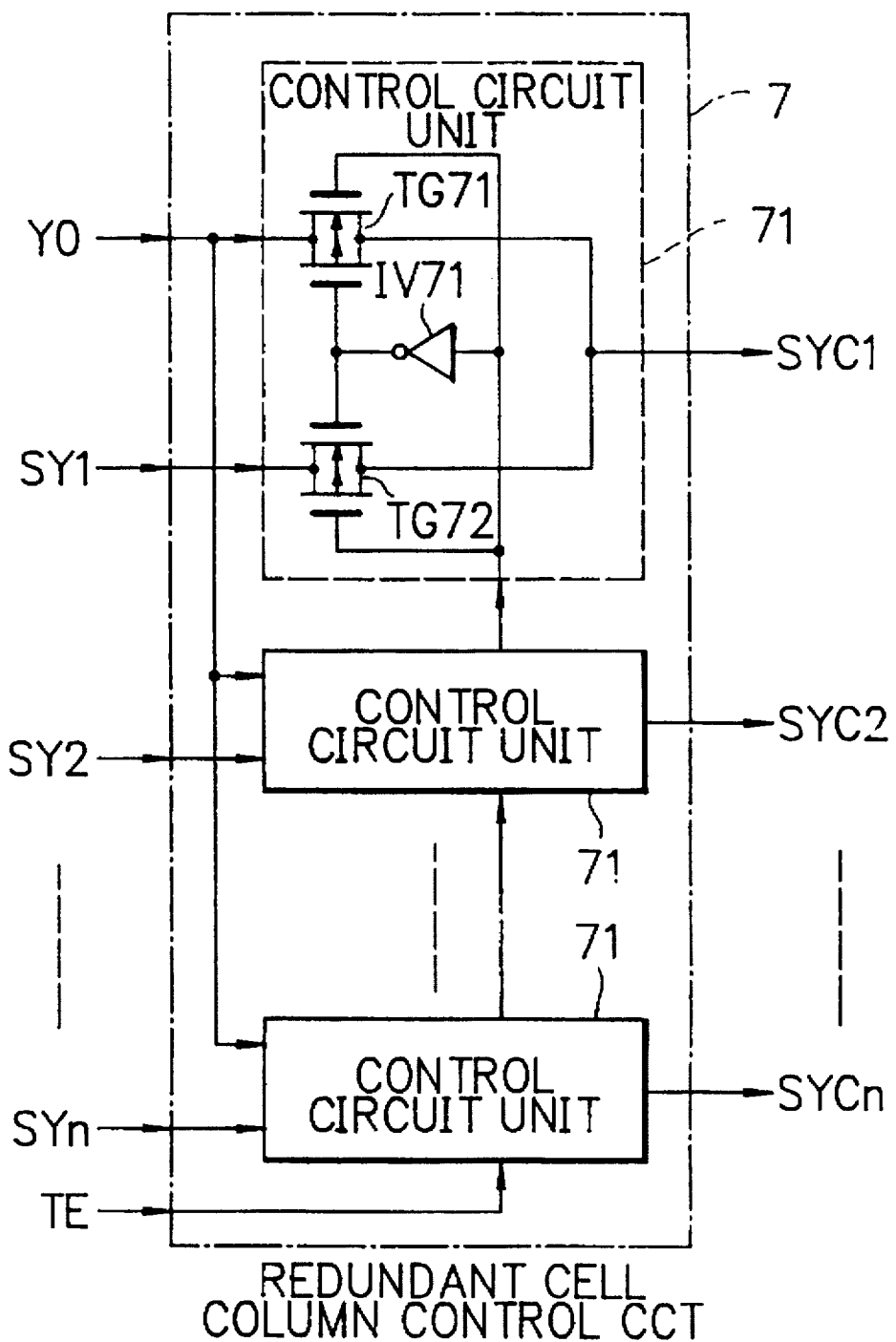
FIG. 7 is a circuit diagram showing the redundant cell column control circuit of the embodiment of FIG. 6.

FIG. 6 shows in a block diagram the semiconductor memory device according to the embodiment of the present invention, and FIG. 7 is a circuit diagram exemplary showing a redundant cell column control circuit of the memory device of FIG. 6.

The embodiment is different from the conventional semiconductor memory device shown in FIGS. 1 to 5 in that there is provided a redundant column control circuit 7 which selects, when the test mode signal TE is at a low level or an inactive level, the redundant cell column select signals SY1 to SYn from a fault address program circuit 3.

Assuming that redundant cell column selection control signals SYC1 to SYCn respectively correspond to the signals SY1 to SYn, the circuit 7 selects, when one of the control signals SYC1 to SYCn is at a selection level or an active level, the predetermined bit of the column select signals Y (Y0 to YN), e.g. Y0 and resultantly outputs therefrom the redundant cell column selection control signals SYC1 to SYCn.

Moreover, in place of the redundant cell column select signals SY1 to SYn, the redundant cell column selection control signals SYC1 to SYCn are supplied to the redundant cell column switch circuits RSW1 to RSWn respectively associated therewith.

As can be seen from FIG. 7, the redundant cell column control circuit 7 includes control circuit units 71 arranged respectively corresponding to the redundant cell column select signals SY1 to SYn.

The control unit 71 includes an inverter IV71 to invert the level of the test mode signal TE and a transfer gate TG71 having an input terminal to receive a predetermined bit Y0 from the column select signal Y.

The gate TG71 is turned on and off, according to the test mode signal TE and a signal output from the inverter IV71.

The control unit 71 further includes a transfer gate TG72 having an input terminal to receive the redundant cell column select signal (SY1 to SYn) associated therewith. The gate TG72 is turned on or off according to the test mode signal TE and a signal output from the inverter IV71 in a fashion opposite to that of the transfer gate TG71.

The control unit 71 resultantly outputs the redundant memory cell column select signals (SYC1 to SYCn) from output terminals respectively of the transfer gates TG71 and TG72.

There will be described actions of the semiconductor memory device according to the embodiment.

In an normal operation mode in which the test mode signal TE is at an inactive level, the redundant cell column controller 7 regulates the redundant cell column selection control signals SYC1 to SYC respectively supplied to the redundant cell column switch circuit RSW1 to RSWn to be equal to the redundant cell column select signals SY1 to SYn.

Therefore, the memory device of the present invention operates in almost the same manner as the conventional memory device shown in FIGS. 1 to 5.

In a test mode operation in which the test mode signal TE is at an active level, the controller 7 supervises each of the signals SYC1 to SYCn respectively supplied to the redundant cell column switch circuit RSW1 to RSWn to be equal to the predetermined bit Y0 of the column select signal Y.

Consequently, in the test mode in which all blocks are in an active state, when the column select signal Y0 is set to a selection level, the system selects the memory cell column of one of the memory cell arrays MA1 to MAn corresponding to the signal Y0 and the redundant cell columns RM1 to RMn at the same time. This makes it possible to simultaneously accomplish the biassing test or the like for the selected memory cell column and redundant cell columns to RMn.

In consequence, without using any additional period of time, the same biassing test can be conducted to the redundant cell columns RM1 to Mn as well as the selected one of the memory cell arrays MA1 to MAn, which guarantees the removal of any one of the redundant cell columns RM1 to RMn in which an initial defect is detected.

Figure 8:
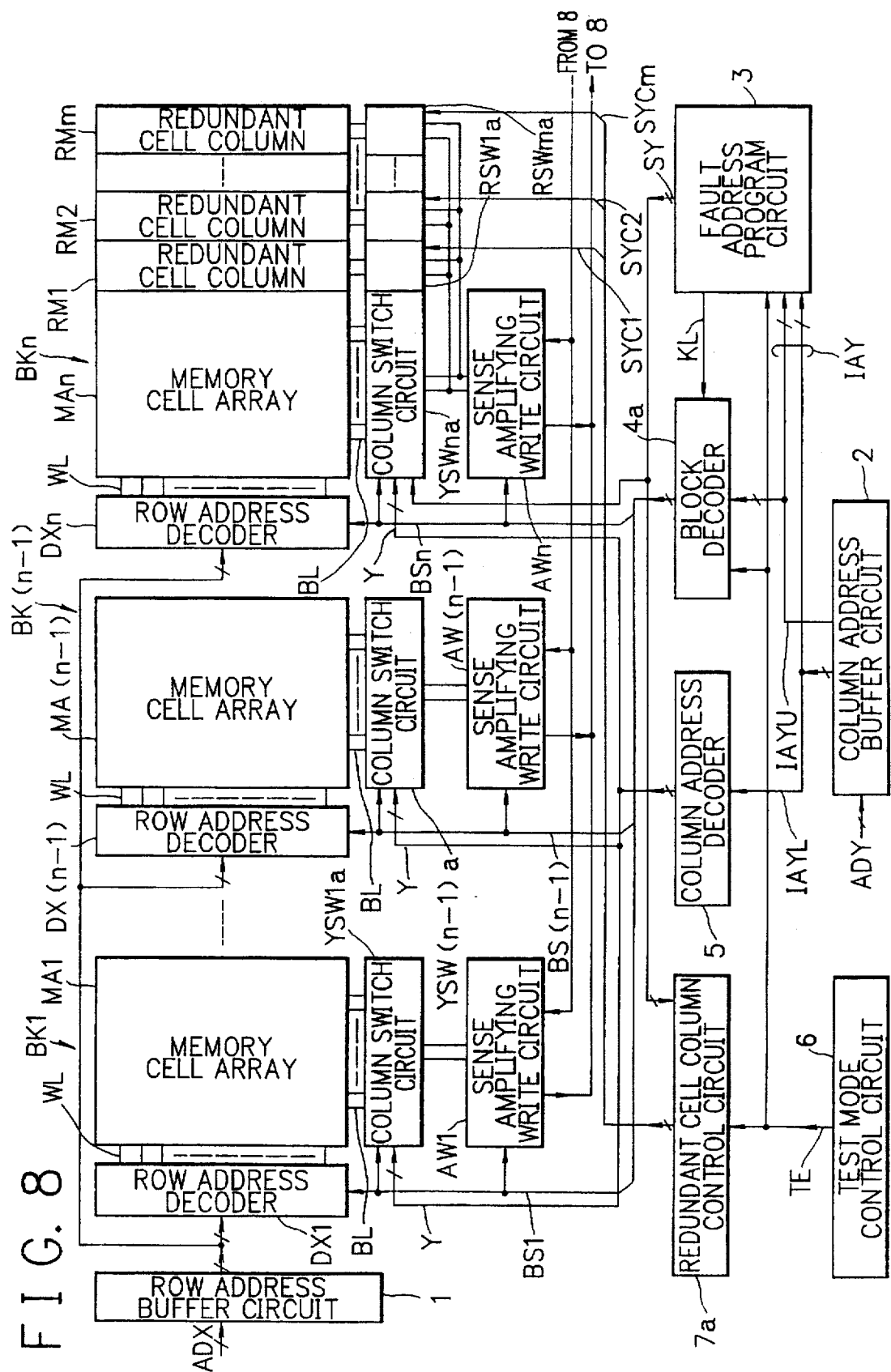
FIG. 8 is a schematic block diagram showing a second embodiment of the semiconductor memory device in accordance with the present invention.
Figure 9:
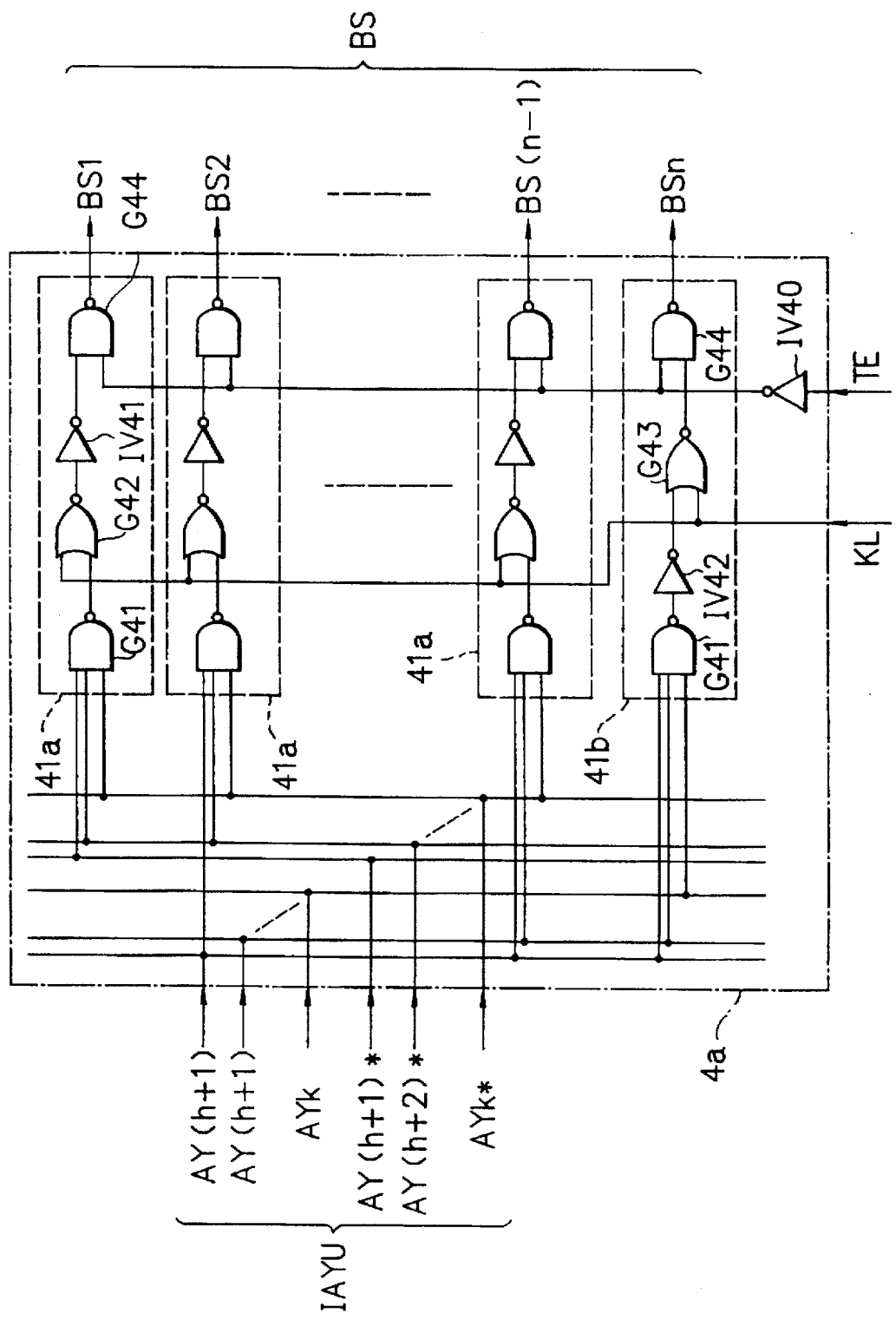
FIG. 9 is a circuit diagram showing the block decoder circuit of the embodiment of FIG. 8.
Figure 10:
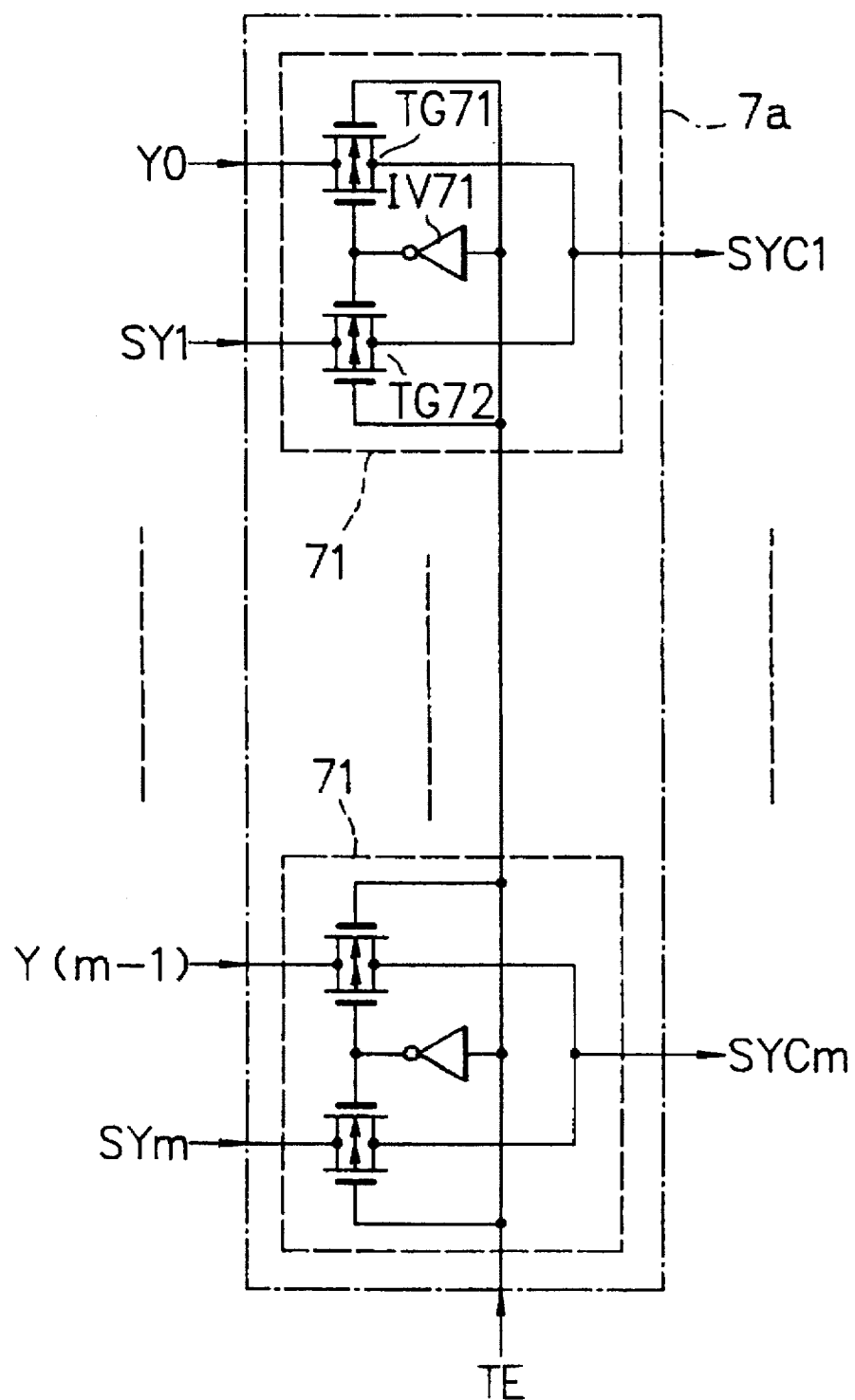
FIG. 10 is a circuit diagram showing the redundant cell column control circuit of the embodiment of FIG. 8.
Figure 11:
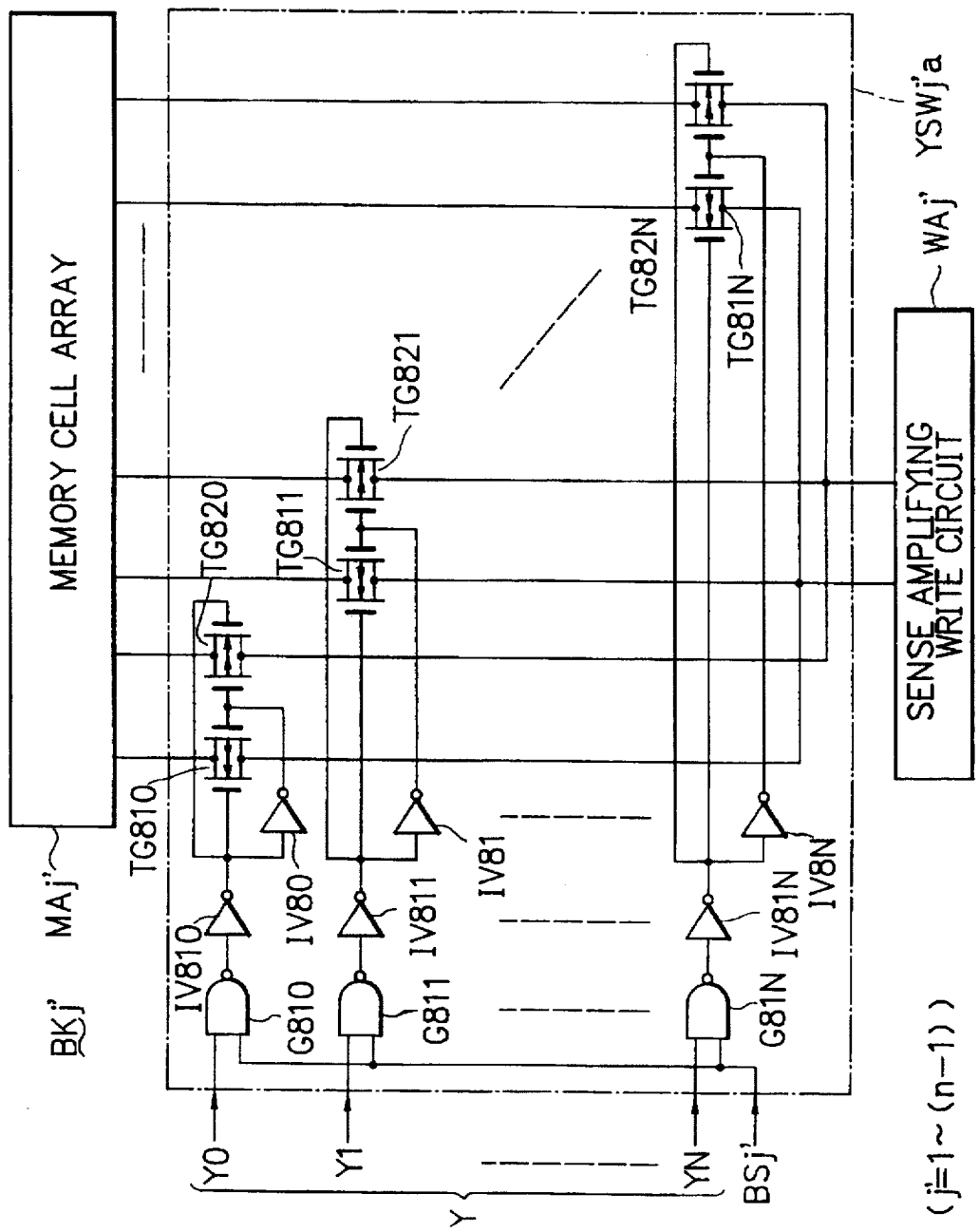
FIG. 11 is a circuit diagram showing the column switch circuit for a block not provided with the redundant cell column of the embodiment of FIG. 8.
Figure 12:
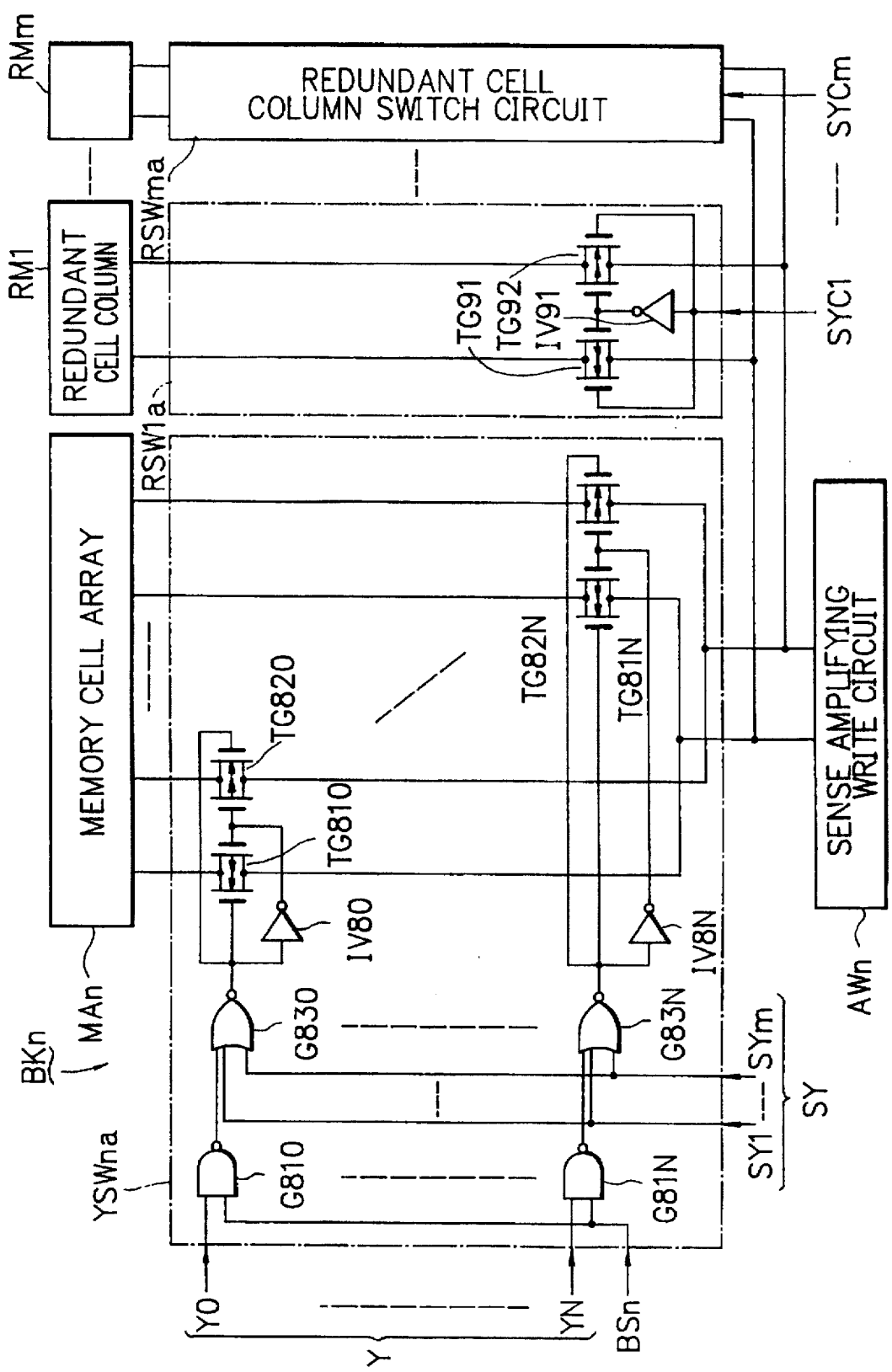
FIG. 12 is a circuit diagram showing the column switch circuit and the redundant cell column switch circuit for a block having the redundant cell column of the embodiment of FIG. 8.

FIG. 8 shows in a block diagram a second embodiment of the semiconductor memory device in accordance with the present invention.

This embodiment differs from the first embodiment as follows.

A plurality of redundant cell columns RM1 to RMm are disposed for only predetermined one (memory cell array MAn in this case) of the plural blocks respectively including the plural memory cell arrays MA1 to MAn.

The embodiment includes a block selection circuit or an array selection circuit 4a, a redundant cell column control circuit 7a, a column switch circuit YSWna corresponding to the predetermined block, and column switch circuits YSW1a to YSW(n−1)a.

With the test mode signal TE at an the low level, when any one of the redundant cell column select signals SY1 to SYm is at the selection level, the circuit 4a activates only a block select signal SYn corresponding to the predetermined block. When the signal TE is at the high level, the control circuit 7a allocates predetermine mutually different bits of the column select signal Y0 to YN) respectively to the redundant cell column selection control signals SYC1 to SYCm respectively associated with the plural memory cell arrays MA1 to MAn.

The column switch circuit YSWna selects, only when the corresponding block select signal BSn is at the selection level and the redundant cell column select signals SY1 to SYm are at the non-selection level, a predetermined memory cell column according to the column select signal Y.

Each of the column switch circuits YSW12 to YSW(n−1)a respectively selects, only when the associated one of the block select signals BS1 to BS(n−1) is at an active level, a predetermined memory cell column of the corresponding memory cell array according the column select signal Y.

FIGS. 9 to 12 respectively show in circuit diagrams examples respectively of the block selection circuit 4a, redundant cell column control circuit 7a, column switch circuits YSW1a to YSW(n−1)a (i.e. YSWj'a; j'=1 to n−1), and column switch circuit YSWna and redundant cell column switch circuits RSW1a to RSWma of the second embodiment.

Figure 4:
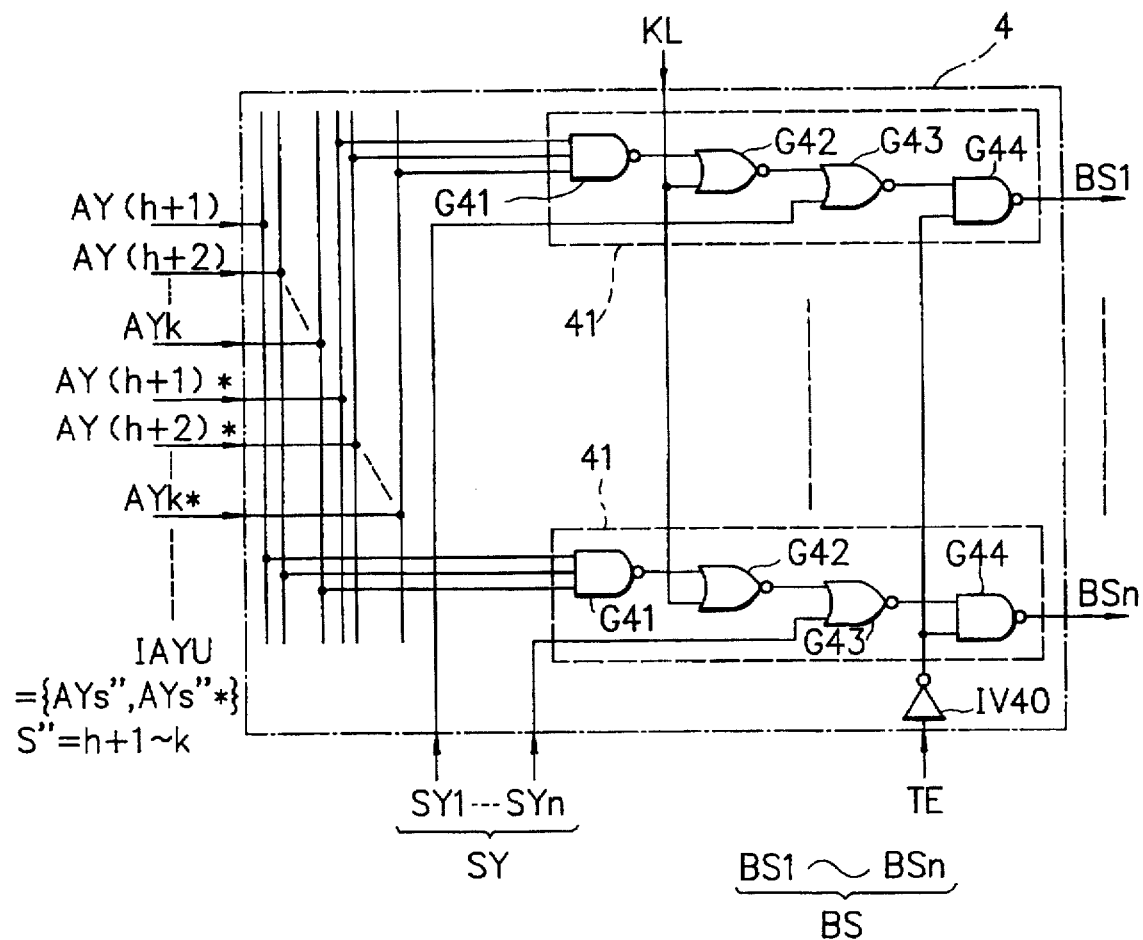
FIG. 4 is a circuit diagram partly showing the block decoder circuit of the memory device of FIG. 1.
Figure 5A:
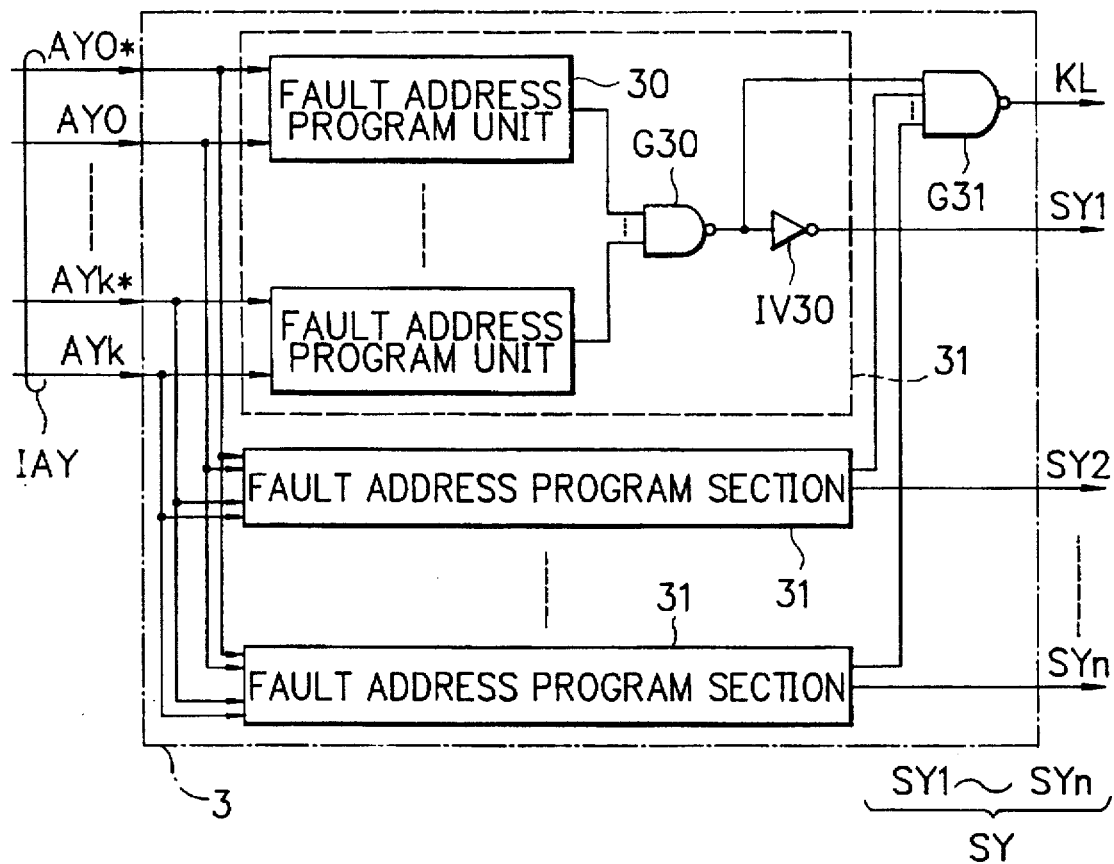
FIG. 5A and 5B are circuit diagrams showing the fault address program circuit of the memory device of FIG. 1.
Figure 5B:
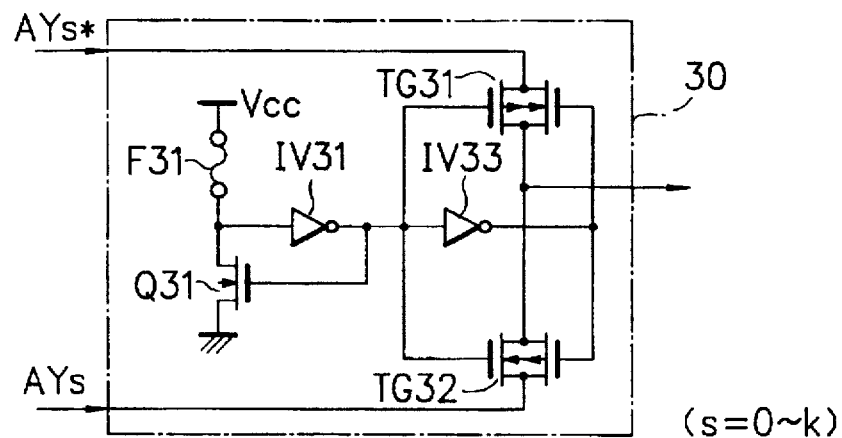

The circuit 4a differs from the block selection circuit 4 of FIG. 4 as follows. A block selection unit 41a is disposed in place of the block selection unit 41 corresponding to each of the block select signals BS1 to BS(n−1). In the unit 41a, an inverter IV41 is adopted for the logic gate G48 of the unit 41. A block selection unit 41b is employed in place of the block selection unit 41 associated with the block select signal BSn. The unit 41b includes an inverter IV42 in place of the logic gate G42. Moreover, in place of the redundant cell column select signal SYn, a selection inhibiting signal KL is input to the logic gate G43.

The circuit 7a is different from the redundant cell column controller 7 of FIG. 7 in that the column select signals to the control unit 71 respectively corresponding to the redundant cell column selection control signals SYC1 to SYCm, which are commonly set to Y0 in the circuit 7, are set to mutually different values as Y0 to Y(m−1) in the circuit 7a.

Figure 2:
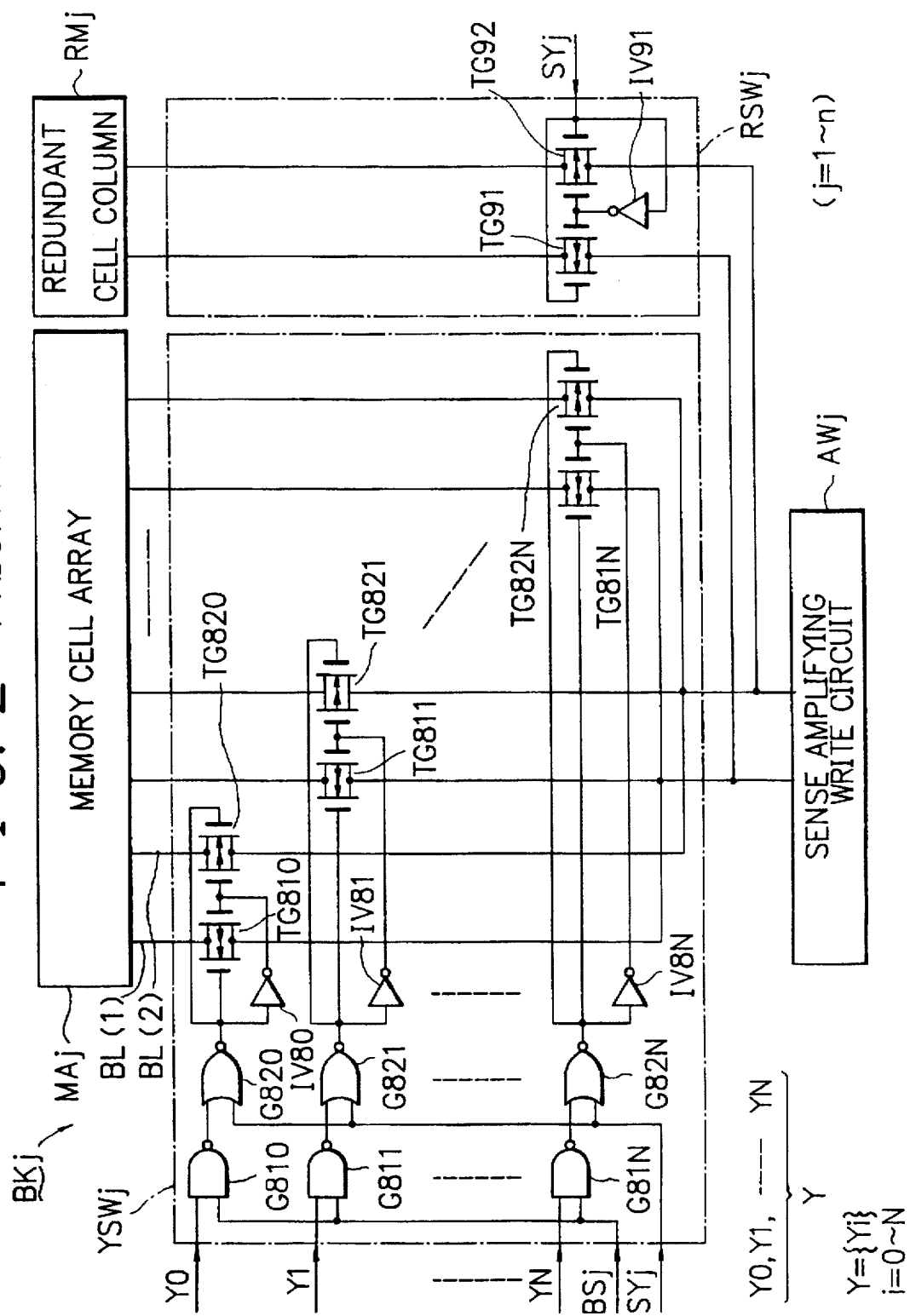
FIG. 2 is a circuit diagram showing the column switch circuit and redundant cell column switch circuit of the memory device of FIG. 1.
Figure 3:
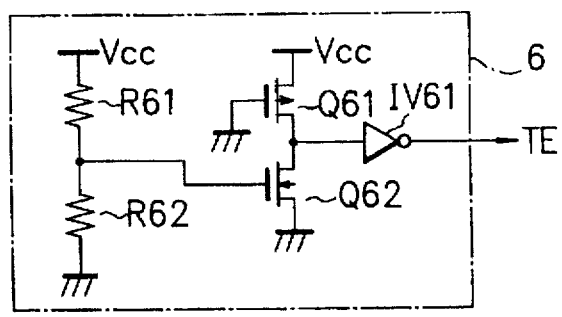
FIG. 3 is a circuit diagram showing the test mode control circuit of the memory device of FIG. 1.

The column switch circuits YSW1a to YSW(n−1) vary from those of FIG. 2 in that inverters IV810 to IV81N are used in place of the logic gates 6820 to G82N in the circuits YSW1a to YSW(n−1).

The column switch circuit YSWna is different from that shown in FIG. 2 in that multi-input NOR gates G830 to G83N are adopted in place of the gates G820 to G82N and redundant cell column select signals SY1 to SYm are utilized in place of the select signals SYn as input signals to the logic gates G830 to G83N.

In this connection, however, to achieve the same advantageous effect, only the redundant cell column select signal SYn may be replaced with the selection inhibiting signal KL without modifying the system configuration as above.

In the first embodiment, the memory cell arrays MA1 to MAn are respectively associated with the redundant cell columns RM1 to RMn; whereas, in the second embodiment, such a one-to-one correspondence is missing therebetween. Although the basic operation of the second embodiment is different from that of the first embodiment in this regard, the other fundamental actions are almost the same as for the first embodiment.

Namely, in the normal operation mode, regardless of presence or absence of the non-conforming memory cell column, when the column address signal ADY specifies an address of other than that of the non-conforming memory cell, the system accesses only the memory cell arrays MA1 to MAn.

When there exists a non-conforming memory cell and the signal ADY designates the address thereof, the redundant cell column select signals associated therewith is set to the selection level such that the blocks respectively including the memory cell arrays MA1 to MA(n−1) are set to an inactive state and the block including the memory cell array MAn is activated.

Resultantly, the memory cell column of the memory cell array MAn is set to a non-selection state and the predetermined redundant cell column is set to a selection state to be accessed thereafter.

In the test mode in which the test mode signal TE is at the high level, the blocks are set to an active state.

When a predetermined memory cell column is selected in the memory cell array MA1 to MAn, the redundant cell columns RM1 to RMm are also selected. However, since the columns RM1 to RMm are connected to one sense amplifying write circuit AWn, it is necessary to minimize the load concentrated onto upon the circuit AWn.

Therefor, the timing points for the selection of the redundant cell columns RM1 to RMm are shifted from each other, for example, to select RM1, RM2..., and RMm according to the select signals Y0, Y1..., Y(m−1), respectively.

Also in the second embodiment, the memory cell column of the memory cell arrays MA1 to MAn and the redundant cell columns RM1 to RMm can be simultaneously selected for the biassing test and the like.

Consequently, like in the first embodiment, it is guaranteed to remove any one of the redundant cell columns RM1 to RMm in which an initial failure is detected.

In accordance with the present invention as described above, when the memory device is in the test mode, the blocks respectively including the plural memory cell arrays are set to an active state such that a predetermined memory cell column of the memory cell arrays and a plurality of redundant cell columns are simultaneously or sequentially selected to achieve the biassing test.

The biassing test of each memory cell column can be similarly conducted for all redundant cell columns without requiring any additional period of time for the test.

Moreover, any one of the redundant cell columns associated with an initial failure can be advantageously removed.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A semiconductor memory device comprising:

a plurality of memory cell arrays each including a plurality of memory cell columns:

a plurality of redundant memory cell columns which can be replaced, when there exist non-conforming memory cell columns in the plural memory cell arrays, with the non-conforming memory cell columns;

a plurality of column switch circuits disposed respectively corresponding to the plural memory cell arrays;

the column switch circuits selecting, when an array selected signal associated therewith is at a selection level and a redundant cell column select signal corresponding thereto is at a non-selection level, a predetermined memory cell column of the associated memory cell array according to a column select signal;

the column switch circuits non-selecting, when the array select signal is at a non-selection level and the redundant cell column select signal is at a selection level, the memory cell columns of the associated memory cell arrays;

a plurality of redundant cell column switch circuits disposed respectively corresponding to the plural redundant memory cell columns for selecting, when a redundant cell column selection control signal associated therewith is at the selection level, a redundant memory cell column corresponding thereto;

a plurality of data input/output means disposed respectively corresponding to the column switch circuits, the data input/output means conducting, when the array select signal corresponding thereto is at the selection level, transmission of read data from a memory cell column selected by the column switch circuit associated with the data input/output means and the redundant memory cell column selected by a predetermined redundant cell column switch circuit and transmission of write data to the memory cell column and the redundant memory cell column;

a test mode control circuit for sensing a preset operation condition and generating a test mode signal at an active level;

a fault address program circuit for storing therein an address of a non-conforming memory cell column of each of the plural memory cell arrays and for setting, when a column address signal designates the address, the redundant cell column select signal associated therewith to the selection level;

an array selection circuit for setting, when the test mode signal is at an inactive level and any one of the redundant cell column select signals is at the selection level, the array select signal corresponding to the redundant cell column select signal in the selection level to the selection level; decoding predetermined one of the column address signals when the redundant cell column select signals are in the non-selection level, deciding the selection or non-selection level of the array select signal, and outputting the signal therefrom; and setting the array select signals to the selection level when the test mode signal is at the active level; and a redundant cell column control circuit for selecting, when the test mode signal is at the inactive level, the redundant cell column select signals from the fault address program circuit and setting the selected redundant cell column select signals as the corresponding redundant cell column selection control signals and selecting, when the test mode signal is at the active level, predetermined bits of the redundant cell column select signal and setting the selected bits as the redundant cell column selection control signal.

2. A semiconductor memory device in accordance with claim 1, wherein a one-to-one correspondence exists between the plural memory cell arrays and the plural redundant memory cell columns.

3. A semiconductor memory device in accordance with claim 1, further including a plurality of redundant memory cell columns only for predetermined one of the plural memory cell arrays, wherein;

the array selection circuit sets, when the test mode signal is at the inactive level and any one of the redundant cell column select signals is at the selection level only the array select signal associated with the predetermined memory cell array to the selection level;

the redundant cell column control circuit allocates, when the test mode signal is at the active level, mutually different bits of the column select signal to each of the plural redundant memory cell columns and each of the redundant cell column selection control signals associated therewith;

the column switch circuit corresponding to the predetermined memory cell array selects, only when the corresponding array select signal is at the selection level and the redundant cell column selects signals are at the non-selection level a predetermined memory cell column according to the column select signal;

each of the column switch circuits other than the column switch circuit corresponding to the predetermined memory cell array selects, only when the associated array select signal is at the selection level, a predetermined memory cell column of the corresponding memory cell array according to the column select signal.

4. a semiconductor memory device in accordance with claim 1, wherein the preset operation condition is an event in which a power supply voltage applied to the memory device is more than that applied to the memory device in a normal operation state.

* * * * *